US011387617B2

(12) United States Patent
DeRoy et al.

(10) Patent No.: US 11,387,617 B2
(45) Date of Patent: Jul. 12, 2022

(54) SYSTEMS AND METHODS FOR PROVIDING A SOLDERED INTERFACE ON A PRINTED CIRCUIT BOARD HAVING A BLIND FEATURE

(71) Applicant: Eagle Technology, LLC, Melbourne, FL (US)

(72) Inventors: Michael T. DeRoy, Melbourne, FL (US); Andres M. Gonzalez, Melbourne, FL (US); Phill Nickel, Palm Bay, FL (US); Scott Nelson, Palm Bay, FL (US); Bill Marquart, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 17/319,993

(22) Filed: May 13, 2021

(65) Prior Publication Data
US 2021/0265795 A1    Aug. 26, 2021

Related U.S. Application Data

(62) Division of application No. 16/522,889, filed on Jul. 26, 2019, now Pat. No. 11,056,850.

(51) Int. Cl.
*H05K 3/12*      (2006.01)
*H01R 43/02*      (2006.01)
(Continued)

(52) U.S. Cl.
CPC ......... *H01R 43/0256* (2013.01); *H01R 12/58* (2013.01); *H01R 43/0235* (2013.01);
(Continued)

(58) Field of Classification Search
CPC ... H05K 3/1216; H05K 3/1225; H05K 3/1233
See application file for complete search history.

(56) References Cited

U.S. PATENT DOCUMENTS

| 4,290,195 A | 9/1981 | Rippere |
| 6,076,726 A | 6/2000 | Hoffmeyer et al. |

(Continued)

FOREIGN PATENT DOCUMENTS

JP      20000208918 A      7/2000

OTHER PUBLICATIONS

Herbert Endres, Molex, Solder Charge—An Alternative to BGA, SMT7, Dec. 31, 1969.
(Continued)

*Primary Examiner* — Jeremy C Norris
(74) *Attorney, Agent, or Firm* — Fox Rothschild LLP; Robert J. Sacco; Carol Thorstad-Forsyth

(57) ABSTRACT

Systems and methods for providing a soldered interface between a circuit board and a connector pin. The methods comprise: using a jet paste dispenser to apply first solder into a plated contact cavity formed in the circuit board; using a stencil screen printer to apply second solder (a) over the plated contact cavity which was at least partially filled with the first solder by the jet paste dispenser and (b) over at least a portion of a pad surrounding the plated contact cavity; inserting the connector pin in the plated contact cavity such that the connector pin passes through the second solder and extends at least partially through the first solder; and performing a reflow process to heat the first and second solder so as to create a solder joint between the circuit board and the connector pin.

12 Claims, 16 Drawing Sheets

(51) Int. Cl.
*H05K 1/11* (2006.01)
*H01R 12/58* (2011.01)
*H05K 1/02* (2006.01)
*H01R 12/73* (2011.01)

(52) U.S. Cl.
CPC ........... *H05K 1/0228* (2013.01); *H05K 1/115* (2013.01); *H05K 3/1216* (2013.01); *H01R 12/737* (2013.01); *H05K 2201/096* (2013.01); *H05K 2201/09509* (2013.01)

(56) References Cited

U.S. PATENT DOCUMENTS

| | | |
|---|---|---|
| 6,486,415 B2 | 11/2002 | Jimarez et al. |
| 6,917,525 B2 | 7/2005 | Mok et al. |
| 6,981,320 B2 | 1/2006 | Ho et al. |
| 7,281,321 B2 | 10/2007 | Kim et al. |
| 7,342,803 B2 | 3/2008 | Inagaki et al. |
| 7,908,744 B2 | 3/2011 | Hsu et al. |
| 9,679,841 B2 | 6/2017 | Jomaa et al. |
| 9,761,972 B2 | 9/2017 | Beucler et al. |
| 10,096,915 B2 | 10/2018 | McKenney et al. |
| 10,417,167 B2 | 9/2019 | Buckland et al. |
| 10,517,167 B1 | 12/2019 | DeRoy et al. |
| 2004/0022330 A1 | 2/2004 | Shiozawa et al. |
| 2004/0115968 A1 | 6/2004 | Cohen |
| 2004/0223309 A1 | 11/2004 | Haemer et al. |
| 2004/0256731 A1 | 12/2004 | Mao et al. |
| 2007/0125574 A1 | 6/2007 | Kim et al. |
| 2009/0029031 A1 | 1/2009 | Lowrey |
| 2009/0290316 A1 | 11/2009 | Kariya |
| 2013/0230272 A1 | 9/2013 | Raj et al. |
| 2014/0252638 A1 | 9/2014 | Pandey et al. |
| 2016/0036532 A1 | 2/2016 | Noguchi |
| 2016/0365322 A1 | 12/2016 | Lin et al. |
| 2017/0030340 A1 | 2/2017 | Knoeller et al. |
| 2017/0047686 A1 | 2/2017 | Wig |
| 2017/0149154 A1 | 5/2017 | McKenney et al. |
| 2017/0149155 A1 | 5/2017 | McKenney et al. |
| 2017/0244184 A1 | 8/2017 | McKenney et al. |
| 2017/0303401 A1 | 10/2017 | Rathburn |

OTHER PUBLICATIONS https://vimeo.com/137149174 Samtec Solder Charge Technology, Samtec.com.

US 11,387,617 B2

SYSTEMS AND METHODS FOR PROVIDING A SOLDERED INTERFACE ON A PRINTED CIRCUIT BOARD HAVING A BLIND FEATURE

CROSS REFERENCE TO RELATED APPLICATIONS

This application is a divisional application and claims priority to U.S. patent application Ser. No. 16/522,889 entitled "SYSTEMS AND METHODS FOR PROVIDING A SOLDERED INTERFACE ON A PRINTED CIRCUIT BOARD HAVING A BLIND FEATURE" filed on Jul. 26, 2019, the content of which is incorporated herewith in its entirety.

BACKGROUND

Statement of the Technical Field

The present disclosure relates generally to electronic interconnect systems. More particularly, the present disclosure relates to implementing systems and methods for providing a soldered interface on a printed circuit board having a blind feature.

Description of the Related Art

VPX is an ANSI standard that provides VMEbus-based systems with support for switched fabrics over a high speed connector. Switched fabrics technology supports the implementation of multiprocessing systems that require the fastest possible communications between processors. The high speed connectors are often referred to in the art as VPX connectors (e.g., the MultiGig RT2 connector available from TE Connectivity of Switzerland). VPX connectors are rated typically to support up to 16 Giga bits per second ("Gbps").

SUMMARY

The present disclosure concerns implementing systems and methods for providing a soldered interface between a circuit board and a connector pin. The methods comprise: using a jet paste dispenser to apply first solder into a plated contact cavity formed in the circuit board; using a stencil screen printer to apply second solder (a) over the plated contact cavity which was at least partially filled with the first solder by the jet paste dispenser and (b) over at least a portion of a pad surrounding the plated contact cavity; inserting the connector pin in the plated contact cavity such that the connector pin passes through the second solder and extends at least partially through the first solder; and performing a reflow process to heat the first and second solder so as to create a solder joint between the circuit board and the connector pin. The first and second solders have a stacked arrangement.

In some scenarios, an amount of the first solder applied by the jet paste dispenser is selected so that a top surface of the first solder is horizontally aligned with a top surface of the circuit board. The second solder fills a space between the top surface of the first solder and the top surface of the pad. Alternatively, the amount of the first solder applied by the jet paste dispenser is selected so that a top surface of the first solder resides at a level between a top surface of the circuit board and a top surface of the pad. The second solder fills a space between the top surface of the first solder and the top surface of the pad.

In those or other scenarios, the amount of the first solder applied by the jet paste dispenser is selected so that a top surface of the first solder is horizontally aligned with a top surface of the pad. Each of the first and second solders may comprise a leaded solder paste or lead free solder paste.

In those or other scenarios, the circuit board comprises: a core substrate comprising a plurality of laminated dielectric substrate layers with a first via formed therethrough; a first trace disposed on an exposed surface of the core substrate that is in electrical contact with the first via; a first High Density Interconnect ("HDI") substrate laminated to the core substrate such that the first trace electrically connects the first via with a second via formed through the first HDI substrate; a second trace disposed on an exposed surface of the first HDI substrate that is in electrical contact with the second via; and a second HDI substrate laminated to the first HDI substrate such that the second trace electrically connects the second via to a third via formed through the second HDI substrate. The second via comprises a buried via with a central axis spatially offset from central axis of the first and third vias, and the first and second vias having diameters which are smaller than a diameter of the third via.

The third via comprises the plated contact cavity. The central axis of the first via is aligned with the central axis of the third via, and the central axis of the second via is horizontally offset from the central axis of the first and third vias. The diameter of the second via is smaller than the diameter of the first via.

The present document also concerns a circuit board. The circuit board comprises: a substrate; a plated contact cavity formed in the substrate; a pad disposed on the substrate so as to at least partially surround the plated contact cavity; a first solder applied to the plated contact cavity using a jet paste dispenser; and a second solder applied using a stencil screen printer (a) over the plated contact cavity which is at least partially filled with the first solder and (b) over at least a portion of the pad.

In some scenarios, a connector pin is inserted in the plated contact cavity such that the connector pin passes through the second solder and extends at least partially through the first solder. The first and second solders are reflowed to create a solder joint between the substrate and the connector pin.

In those or other scenarios, an amount of the first solder applied by the jet paste dispenser is selected so that a top surface of the first solder is horizontally aligned with a top surface of the substrate. The second solder fills a space between the top surface of the first solder and the top surface of the pad. Alternatively, the amount of the first solder applied by the jet paste dispenser is selected so that (1) a top surface of the first solder resides at a level between a top surface of the substrate and a top surface of the pad, or (2) a top surface of the first solder is horizontally aligned with a top surface of the pad. In the case of (1), the second solder fills a space between the top surface of the first solder and the top surface of the pad.

In those or other scenarios, the substrate comprises: a core substrate comprising a plurality of laminated dielectric substrate layers with a first via formed therethrough; a first trace disposed on an exposed surface of the core substrate that is in electrical contact with the first via; a first HDI substrate laminated to the core substrate such that the first trace electrically connects the first via with a second via formed through the first HDI substrate; a second trace disposed on an exposed surface of the first HDI substrate that is in electrical contact with the second via; and a second HDI substrate laminated to the first HDI substrate such that the second trace electrically connects the second via to a third via formed through the second HDI substrate. The second via comprises a buried via with a central axis spatially offset from central axis of the first and third vias, and the first and second vias having diameters which are smaller than a diameter of the third via.

BRIEF DESCRIPTION OF THE DRAWINGS

The present solution will be described with reference to the following drawing figures, in which like numerals represent like items throughout the figures.

DETAILED DESCRIPTION

Figure 1:
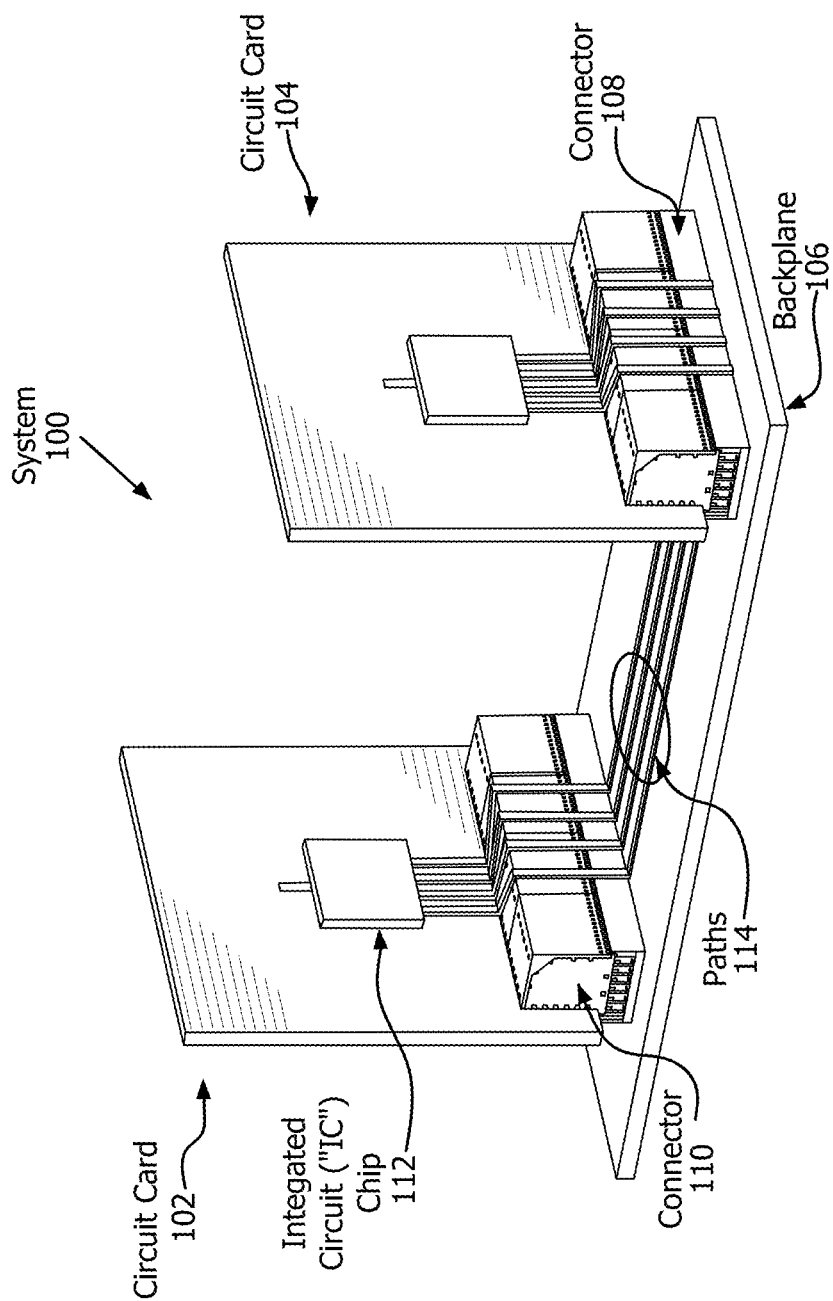
FIG. 1 provides an illustration of an illustrative system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The current generation of industry standard VPX connectors are challenged to support a 25 Giga bits per second ("GBps") data rate at Bit Error Rates ("BER") of 1E-15 or better when trying to communicate from a 25 Gbps transceiver chip on the first daughter card, through a VPX connector, across 12 inches of backplane, through another VPX connector to a second transceiver chip on a second daughter card. Accordingly, the present solution provides a connector that is designed to address this drawback of conventional VPX connectors. The connector is also compliant to and can be used for avionics applications. As such, the connector will survive avionics environmental exposures, as well as other harsh environments associated with military hardware applications.

Analysis shows a limitation of conventional VPX connectors (e.g., VITA46 connectors) to 25 Gbps operation is the crosstalk occurring in the via field directly underneath the VPX connectors on both the circuit (or daughter) cards and the backplane. The present solution involves a novel refinement to the VPX standard connector pins, and a novel Printed Wiring Board ("PWB") structure that uses Double Transition ("DT") vias which reduce cross talk in the via field directly underneath the VPX connector, yet does not reduce the VPX connectors ability to survive the environment.

The present solution also involves systems and methods for providing a soldered interface between a circuit board and a connector pin. The methods comprise: using a jet paste dispenser to apply first solder into a plated contact cavity formed in the circuit board; using a stencil screen printer to apply second solder (a) over the plated contact cavity which was at least partially filled with the first solder by the jet paste dispenser and (b) over at least a portion of a pad surrounding the plated contact cavity; inserting the connector pin in the plated contact cavity such that the connector pin passes through the second solder and extends at least partially through the first solder; and performing a reflow process to heat the first and second solder so as to create a solder joint between the circuit board and the connector pin. The first and second solders have a stacked arrangement.

In some scenarios, an amount of the first solder applied by the jet paste dispenser is selected so that a top surface of the first solder is horizontally aligned with a top surface of the circuit board. The second solder fills a space between the top surface of the first solder and the top surface of the pad. Alternatively, the amount of the first solder applied by the jet paste dispenser is selected so that a top surface of the first solder resides at a level between a top surface of the circuit board and a top surface of the pad. The second solder fills a space between the top surface of the first solder and the top surface of the pad.

In those or other scenarios, the amount of the first solder applied by the jet paste dispenser is selected so that a top surface of the first solder is horizontally aligned with a top surface of the pad. Each of the first and second solders may comprise a leaded solder paste or lead free solder paste.

In those or other scenarios, the circuit board comprises: a core substrate comprising a plurality of laminated dielectric substrate layers with a first via formed therethrough; a first trace disposed on an exposed surface of the core substrate that is in electrical contact with the first via; a first High Density Interconnect ("HDI") substrate laminated to the core substrate such that the first trace electrically connects the first via with a second via formed through the first HDI substrate; a second trace disposed on an exposed surface of the first HDI substrate that is in electrical contact with the second via; and a second HDI substrate laminated to the first HDI substrate such that the second trace electrically connects the second via to a third via formed through the second HDI substrate. The second via comprises a buried via with a central axis spatially offset from central axis of the first and third vias, and the first and second vias having diameters which are smaller than a diameter of the third via.

The third via comprises the plated contact cavity. The central axis of the first via is aligned with the central axis of the third via, and the central axis of the second via is horizontally offset from the central axis of the first and third vias. The diameter of the second via is smaller than the diameter of the first via.

The present document also concerns a circuit board. The circuit board comprises: a substrate; a plated contact cavity formed in the substrate; a pad disposed on the substrate so as to at least partially surround the plated contact cavity; a first solder applied to the plated contact cavity using a jet paste dispenser; and a second solder applied using a stencil screen printer (a) over the plated contact cavity which is at least partially filled with the first solder and (b) over at least a portion of the pad.

In some scenarios, a connector pin is inserted in the plated contact cavity such that the connector pin passes through the second solder and extends at least partially through the first solder. The first and second solders are reflowed to create a solder joint between the substrate and the connector pin.

In those or other scenarios, an amount of the first solder applied by the jet paste dispenser is selected so that a top surface of the first solder is horizontally aligned with a top surface of the substrate. The second solder fills a space between the top surface of the first solder and the top surface of the pad. Alternatively, the amount of the first solder applied by the jet paste dispenser is selected so that (1) a top surface of the first solder resides at a level between a top surface of the substrate and a top surface of the pad, or (2) a top surface of the first solder is horizontally aligned with a top surface of the pad. In the case of (1), the second solder fills a space between the top surface of the first solder and the top surface of the pad.

In those or other scenarios, the substrate comprises: a core substrate comprising a plurality of laminated dielectric substrate layers with a first via formed therethrough; a first trace disposed on an exposed surface of the core substrate that is in electrical contact with the first via; a first HDI substrate laminated to the core substrate such that the first trace electrically connects the first via with a second via formed through the first HDI substrate; a second trace disposed on an exposed surface of the first HDI substrate that is in electrical contact with the second via; and a second HDI substrate laminated to the first HDI substrate such that the second trace electrically connects the second via to a third via formed through the second HDI substrate. The second via comprises a buried via with a central axis spatially offset from central axis of the first and third vias, and the first and second vias having diameters which are smaller than a diameter of the third via.

Referring now to FIG. 1, there is provided an illustration of an illustrative system 100 that is useful for understanding the present solution. System 100 is designed to test circuit cards for performance in accordance with IEEE standards and by emulating the final system in which the circuit cards will be disposed. In this regard, system 100 comprises circuit cards 102, 104 and a backplane 106. A rack (not shown in FIG. 1) mechanically supports the circuit cards and backplanes in their relative vertical and horizontal positions. Such a rack is well known in the art, and will not be described herein.

Integrated Circuit ("IC") chips 112 of the circuit cards 102, 104 are electrically connected to each other through connectors 108, 110 and traces (notionally shown) formed in the backplane 106. Paths 114 are provided to show these electrical connections between the IC chips 112 through components 106, 108, 110. In some scenarios, the IC chips 112 include communications technology, such as transceivers. Transceivers are well known in the art, and therefore will not be described herein. Any known or to be known transceiver can be used herein without limitation. During operations, data is communicated between IC chips 112 at a relatively high speed of a 25 Gbps data rate with a BER of 1E-15 or better. This high speed data communication is facilitated by the present solution including novel connectors 108, 110 and via designs which will become more evident as the discussion progresses. The present solution is compliant with the VITA base standard defining physical features that enable high speed communication in a system.

Figure 2:
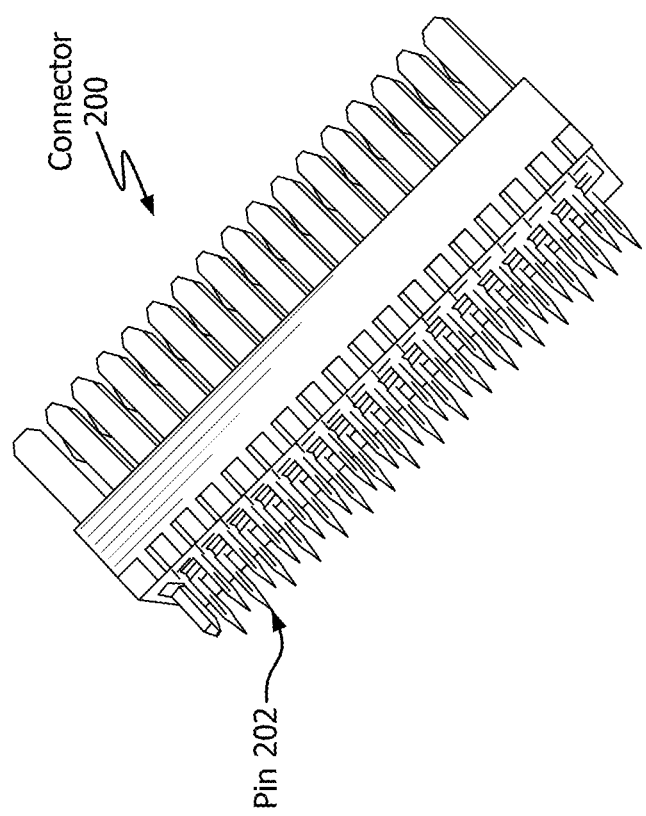
FIG. 2 provides an image of an illustrative connector.

An illustration of a conventional VPX connector 200 is provided in FIG. 2. VPX connector 200 is designed for press-fit applications and is rated to support up to 16 Giga bits per second ("Gbps"). As shown in FIG. 2, the VPX connector 200 comprises a plurality of elongate pins 202. The length of the pins 202 are selected such that the pins respectively pass through vias formed in the backplane. These vias are through hole type vias 600 as shown in FIG.

6. Accordingly, the elongate lengths of the pins 202 are typically between 60-90 mils.

The connectors 108, 110 of FIG. 1 comprise a modified version of VPX connector 200. In this regard, it should be understood that the pins of connectors 108, 110 have smaller elongate lengths than that of pins 202. As noted above, the elongate lengths of conventional pins 202 are between 60-90 mils. In contrast, the elongate lengths of the pins of connectors 108, 110 are between 25-30 mils in some scenarios. The short pins allow the connectors 108, 110 to be mounted to the circuit cards 102, 104 by way of surface mounts or solder interfaces. This difference is important since it facilitates a reduction in cross talk interferences within the connectors 108, 110 and the circuit cards 102, 104. In this regard, it should be understood that the longer the pins the greater the cross talk interference. Cross talk is minimized by decreasing the length of the pins.

Additionally, to establish the 25 Gbps performance, a novel interconnect and layering (or junction) configuration is provided with the PWB 106, 108, 110 to minimize the cross talk and electrical performance within the PWB. This novel interconnect and layering (or junction) configuration will become more evident as the discussion progresses.

Figure 3:
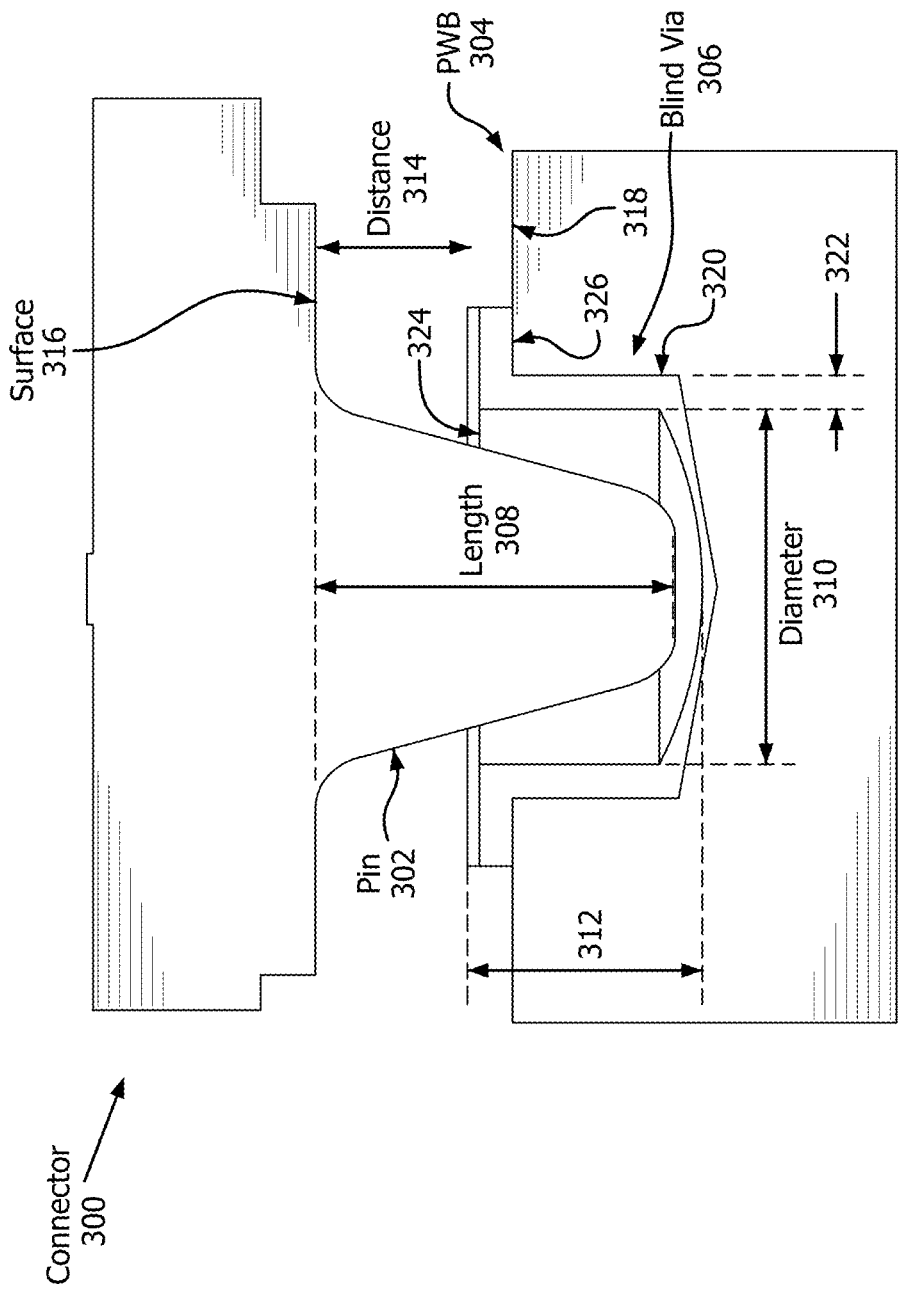
FIG. 3 provides an illustration that is useful for understanding a connector and PWB architecture in accordance with the present solution.

Referring now to FIG. 3, there is provided a cross-sectional view that is useful for understanding an interconnect interface between pin(s) 302 of a connector 300 and a PWB 304 in accordance with the present solution. Connectors 108, 110 of FIG. 1 can be the same as or similar to connector 300, and/or the boards 102, 104, 106 of FIG. 1 can be the same as or similar to PWB 304. As such, the discussion of connector 300 and PWB 304 is sufficient for understanding components 102-110 of FIG. 1.

Although connector 300 is shown as having a single pin 302, the present solution is not limited in this regard. Connector 300 can have any number of pins selected in accordance with a particular application. The pins can have an array format defined by rows and columns, which may be equally spaced apart.

Pin 302 is soldered to blind via 306. The solder is not shown in FIG. 3 for purposes of simplifying the illustration. Pin 302 has a length and the blind via 306 has a shape/size which are selected to ensure that (a) a certain distance 314 is provided between the connector's surface 316 and the PWB's surface 318 and (b) a satisfactory solder based connection is made between the connector 300 and PWB 304. In some scenarios, the pin's length 308 is between 25-30 mils. The distance 314 between the surface's 316, 318 is 10-15 mils. The aperture 324 of blind via 306 has a diameter 310 of 25 mils and a depth 312 of 15 mils selected for optimizing solderability of the pin 302 to the PWB 304. The cladding 320 of blind via 306 has a thickness 322 of 5 mils. The present solution is not limited to the particulars of this example.

Notably, the depth 312 of the via 306 into which the pin 302 is disposed is significantly less than that of conventional connector 200. As noted above, the via 600 which is used for each pin 202 of connector 200 is a through hole with a depth 604. Depth 312 is at least reduced by 50% as compared to depth 604. This via depth reduction is at least partially facilitated by the overall design of a novel via with multiple structural interconnected portions. One of these interconnected portions comprises the blind via 306. Notably, the interconnection between blind via 306 and another structural portion of the novel via is not shown in FIG. 3 for purposes of illustrative simplicity.

Figure 4:
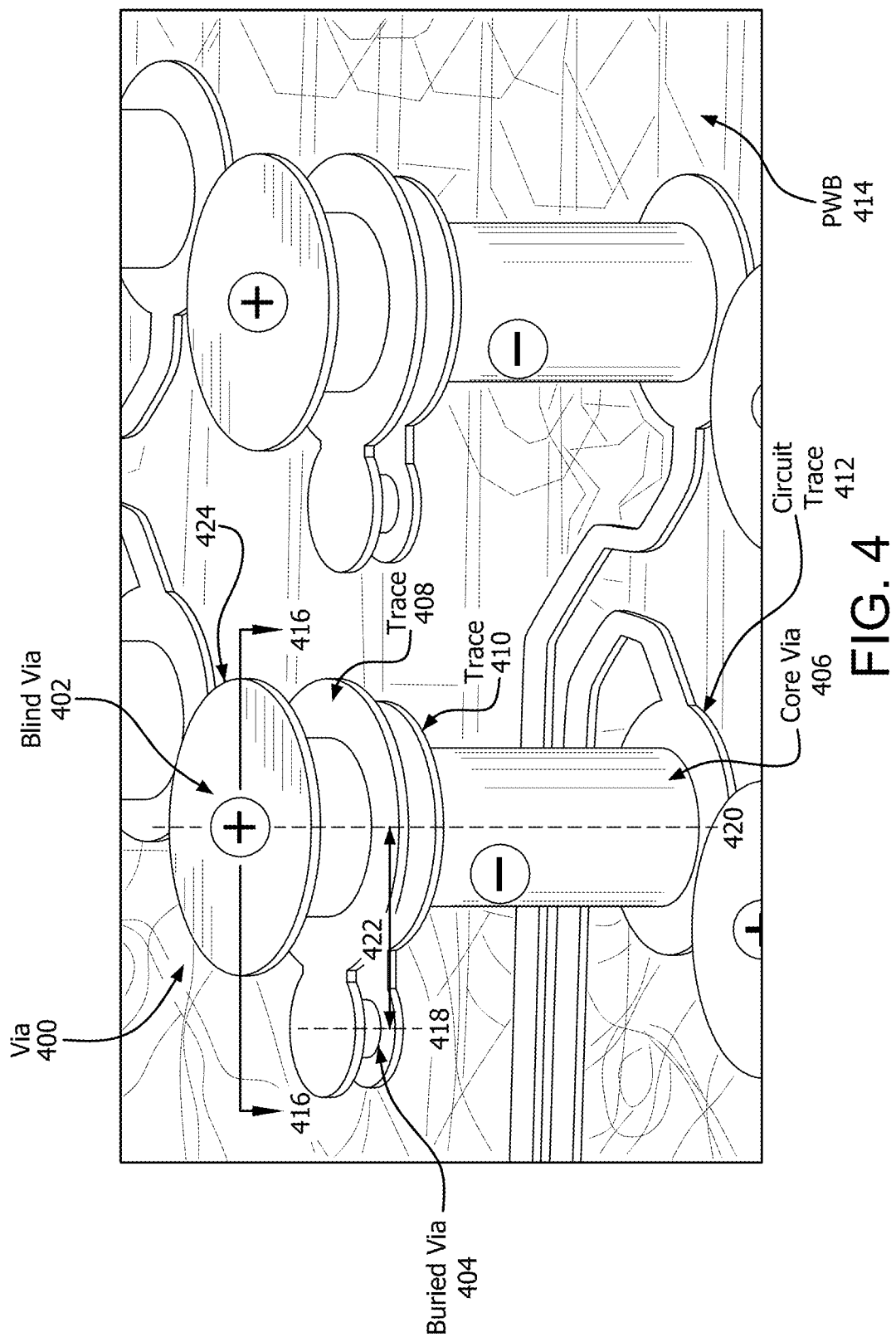
FIG. 4 provides an illustration that is useful for understanding a via design in accordance with the present solution.

Referring now to FIG. 4, there is provided a perspective view of an illustrative novel via 400 formed in a PWB 414 in accordance with the present solution. The PWB 414 is formed of a plurality of laminated substrate layers, which are not shown in FIG. 4 for illustrative simplicity. The via 400 is provided to connect a pin of a connector (e.g., pin 302 of FIG. 3) to a circuit trace 412 formed on an internal substrate layer of the PWB 414.

As shown in FIG. 4, via 400 comprises a blind via 402, a buried via 404 and a core via 406. Blind via 306 of FIG. 3 corresponds to blind via 402. Blind via 402 can be same as or similar to blind via 306. As such, the discussion provided above in relation to blind via 306 is sufficient for understanding blind via 402. Blind via 402 is the via into which the connector pin is inserted and solder interfaced with the PWB 414. A cross-sectional view of the via 400 taken along line 416-416 is provided in FIG. 5.

Figure 5:
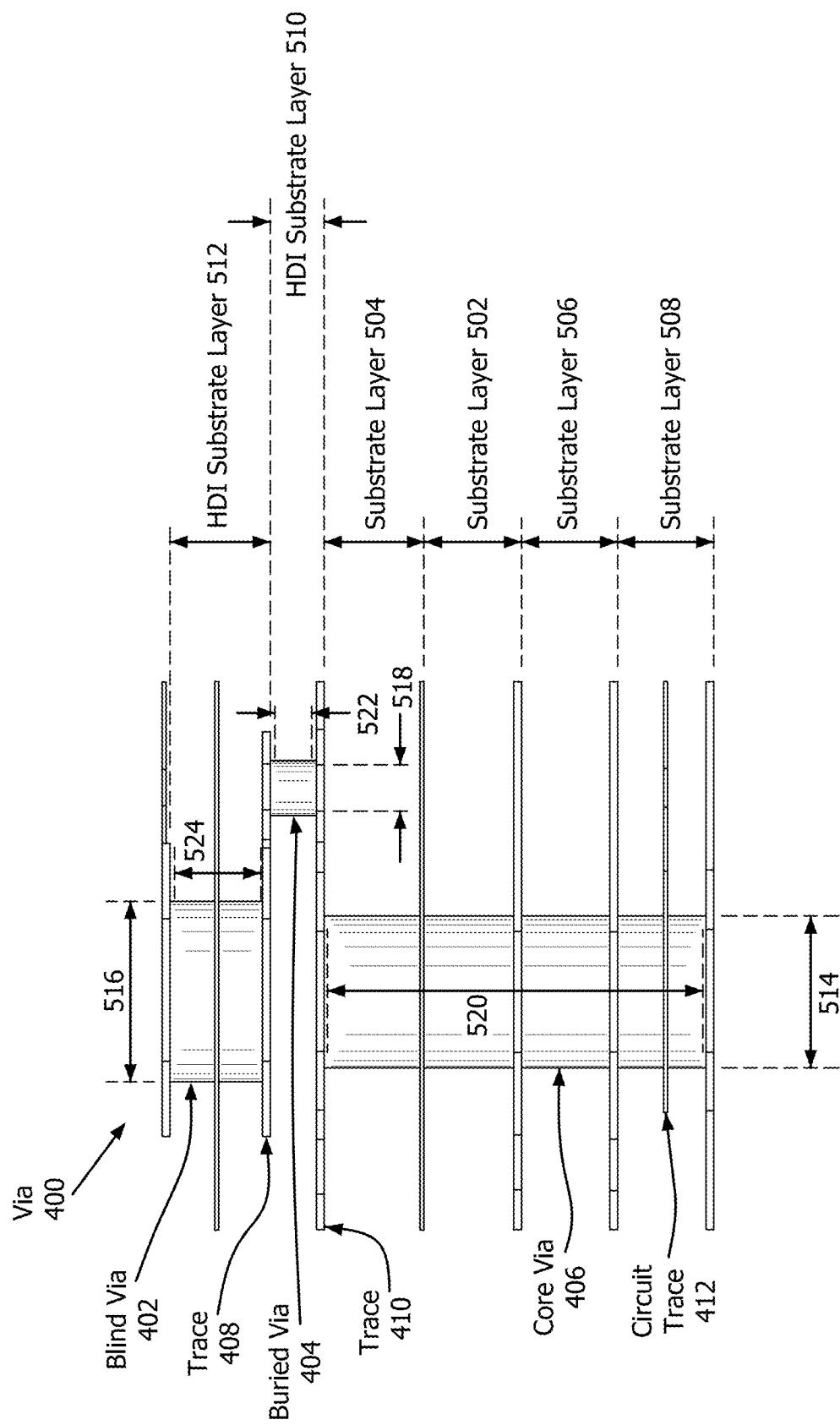
FIG. 5 provides a cross-sectional view of a via taken along lines 416-416 of FIG. 4.
Figure 6:
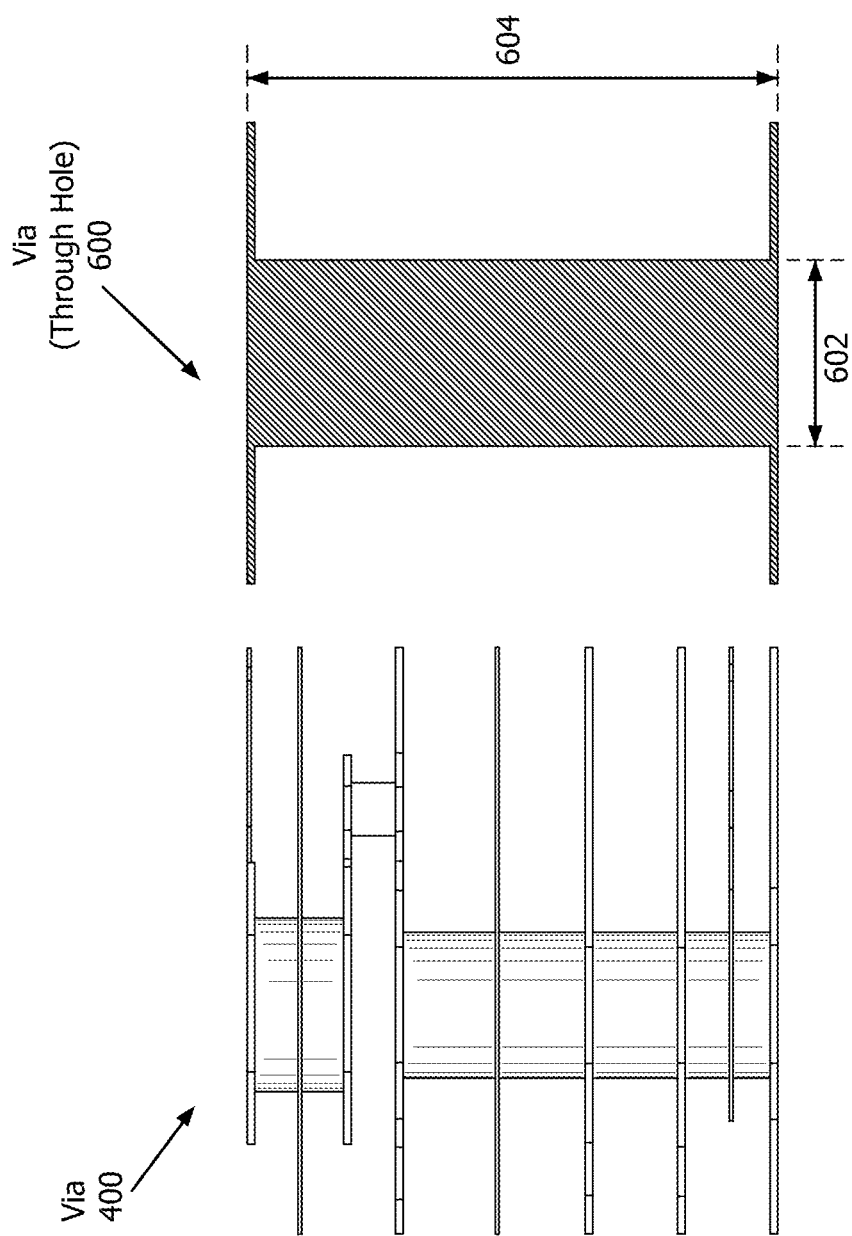
FIG. 6 provides an illustration that is useful for understanding the differences between the present solution and a conventional through hole via.

As shown in FIGS. 4-5, blind via 402 is electrically connected to buried via 404 by way of trace 408. Buried via 404 is electrically connected to core via 406 by way of trace 410. Blind via 402 and core via 406 have central axis 420 which are aligned with each other. However, core via 406 has a smaller diameter 514 as compared to the diameter 516 of blind via 402. Core via 406 is vertically spaced apart from blind via 402 by a distance. This diameter difference and vertical spacing facilitates the reduction in cross talk interference because a parasitic capacitance between interconnection pairs is minimized.

Buried via 404 has a smaller diameter 518 and depth 522 as compared to those 516/524, 514/520 of blind via 402 and core via 406. In some scenarios, the depth 522 of buried via 404 is between 3-6 mils. The present solution is not limited in this regard. The depth 522 is selected based on a given application. The smaller the depth 522 the less reflections and cross talk. The central axis 418 of buried via is horizontally offset from the central axis 420 of vias 402, 406. The distance 422 between central axis 418 and central axis 420 is selected so that the buried via 404 does not overlap any portion of buried via 404 and/or core via 406. The offset arrangement and reduced sizing of buried via 404 also facilitates the reduction in cross talk interference.

Also, the length 520 of core via 406 is variable and depends on the particulars of a given application. For example, in the scenarios shown in FIGS. 4-5, length 520 is defined by the thickness of substrate layers 502, 504, 506, 510 through which the core via 406 passes. The present solution is not limited in this regard. The PWB can include more or less substrate layers than that shown in FIG. 5. Accordingly, the length 520 of core via 406 can be shorter or longer than that shown in FIGS. 4-5.

Referring now to FIG. 7, illustrations are provided to show how the present solution may be fabricated. In some scenarios, 3-5 lamination cycles are needed to fabricate the present solution, which is less than that required to fabricate a conventional VPX connectors. The present solution is not limited in this regard. The number of lamination cycles needed to form the present solution is dependent on a given application.

In all cases, HDI technology is used to create substrate layers 510 and 512. HDI technology is well known in the art, and therefore will not be described herein. Any known or to be known HDI technology can be used herein without limitation. HDI technology allows for higher circuit density than traditional circuit boards, and improved Radio Frequency ("RF") performance.

Referring now to FIG. 7A-7G, a first lamination cycle is performed to create a laminated core dielectric substrate 708. A second lamination cycle is performed in FIGS. 7H-7M, and a third lamination cycle is performed in FIGS.

7N-7Q. Additional lamination cycles can be performed to add more substrate layers in accordance with a particular application.

Figure 7A:
FIGS. 7A-7Q (collectively referred to as "FIG. 7") provide illustrations that are useful for understanding how the present solution is fabricated.
Figure 7B:
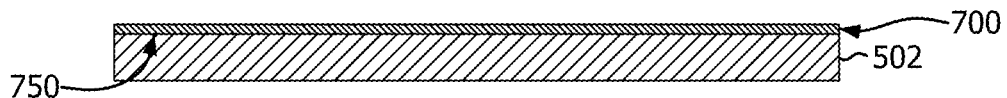

As shown by FIGS. 7A-7G, the core dielectric substrate 708 is formed by laminating a plurality of substrate layers 502-508 together. The lamination process involves acquiring a first substrate layer 502 as in FIG. 7A. The first substrate layer 502 comprises a planar sheet of dielectric material. The dielectric material includes, but is not limited to, a plastic. A first bonding agent 700 is disposed on a first surface 750 of the substrate layer 502, as shown in FIG. 7B. Bonding agents are well known in the art, and therefore will not be described herein. The bonding agent can include, but is not limited to, an adhesive (e.g., glue).

Figure 7C:
Figure 7D:
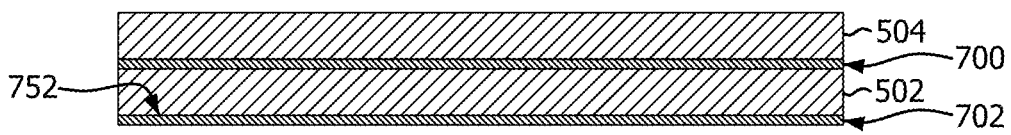

Next in FIG. 7C, a second substrate layer 504 is disposed on top of the bonding agent 700. The second substrate layer 504 comprises a planar sheet of dielectric material. The dielectric material can be the same as or different than that of the first substrate layer 502. In FIG. 7D, a bonding agent 702 is disposed on a second surface 752 of the first substrate layer 502. The bonding agent 702 used here is the same as or different than the bonding agent 700 used in FIG. 7B.

Figure 7E:
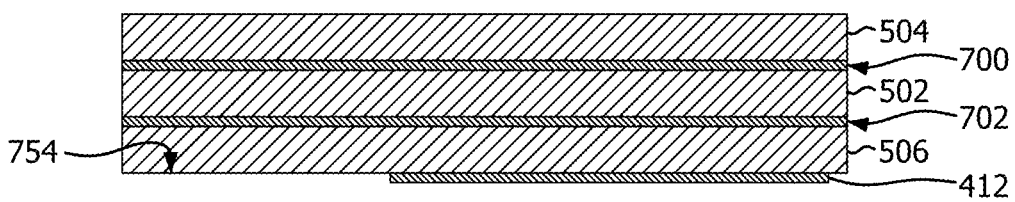
Figure 7F:
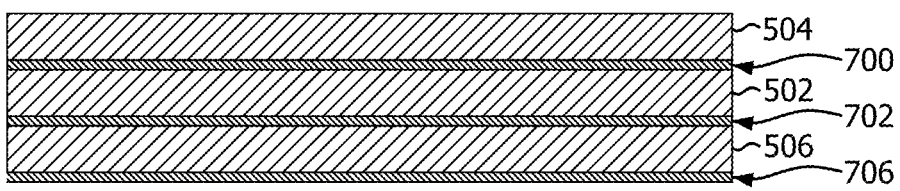

A third substrate layer 506 is then placed on the bonding agent 702 as shown in FIG. 7E. The third substrate layer 506 comprises a planar sheet of dielectric material. The dielectric material can be the same as or different than that of the first substrate layer 502 and/or the second substrate layer 504. A trace 412 is formed on an exposed surface 754 of the third substrate 506, as also shown in FIG. 7E. In FIG. 7F, a bonding agent 706 is then disposed on the exposed surface 754 of the third substrate 506 and trace 412. The bonding agent 706 used here is the same as or different than the bonding agent 700 used in FIG. 7B and/or the bonding agent 702 used in FIG. 7D.

Figure 7G:
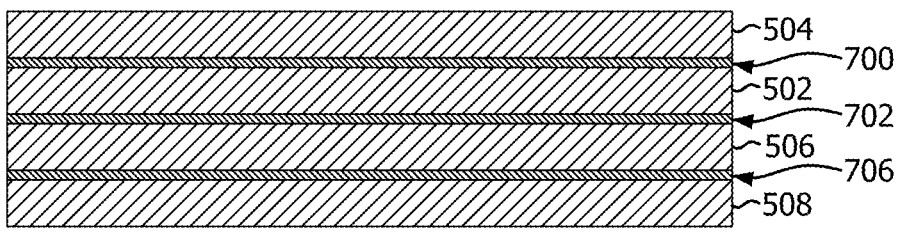
Figure 7G:
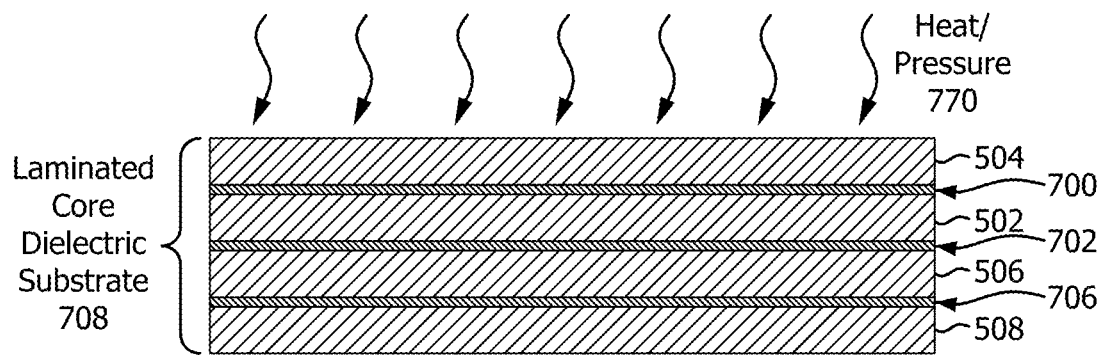

A fourth substrate layer 508 is placed adjacent to the bonding agent 706, as shown in FIG. 7G. The fourth substrate layer 508 comprises a planar sheet of dielectric material. The dielectric material can be the same as or different than that of the other substrate layers 502-506. Subsequently, heat and pressure is applied to the stack of substrate layers for a given period of time as shown by arrows 770 in FIG. 7G'. As a consequence, the laminated core dielectric substrate 708 is formed.

Figure 7H:
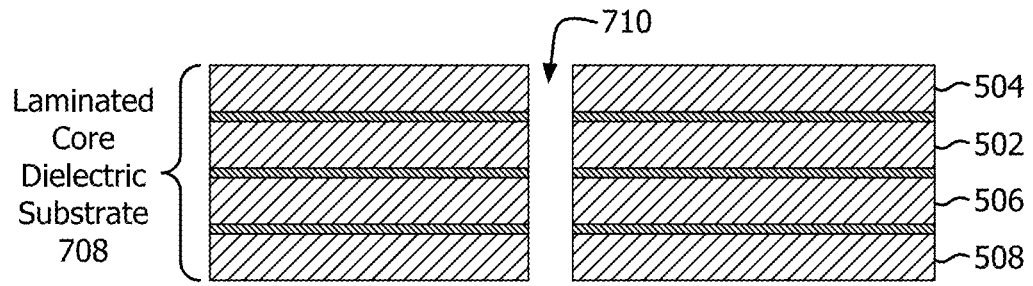
Figure 7I:
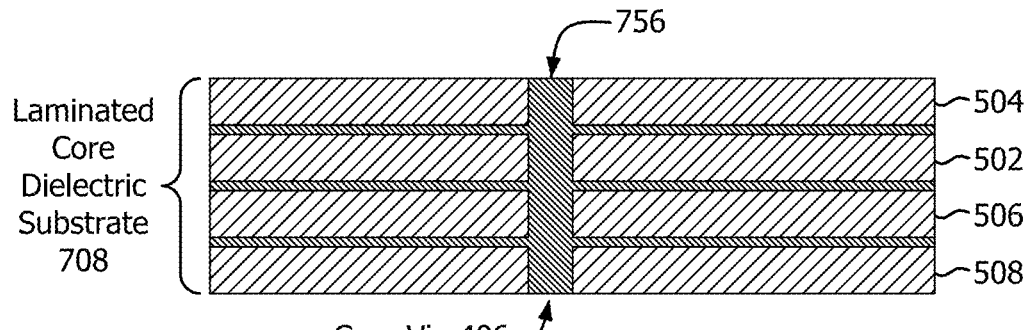

Once the laminated core dielectric substrate 708 is formed, a hole 710 is drilled through substrate layers 502-508 in FIG. 7H. The hole is then filled with an electrically conductive material 756 so as to form the core via 406, as shown in FIG. 7I. The electrically conductive material can include, but is not limited to, copper. Plating may also be performed in FIG. 7I.

Figure 7J:
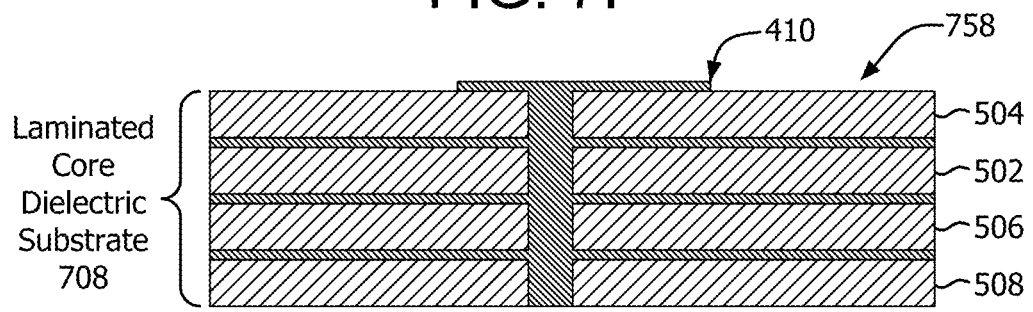
Figure 7K:
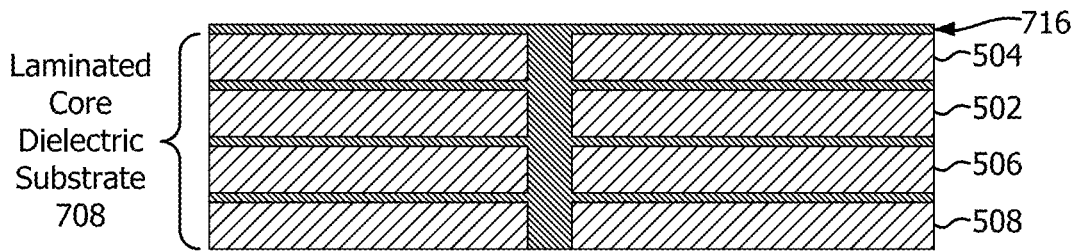

Next in FIG. 7J, trace 410 is formed on an exposed surface 758 of substrate layer 504. An electrically conductive material (e.g., copper) is used to form trace 410. A bonding agent 716 is then disposed on the trace 410 and the exposed surface 758 of substrate layer 504, as shown in FIG. 7K. The bonding agent used here is the same as or different than the bonding agent used in FIG. 7B, FIG. 7D and/or FIG. 7F.

Figure 7L:
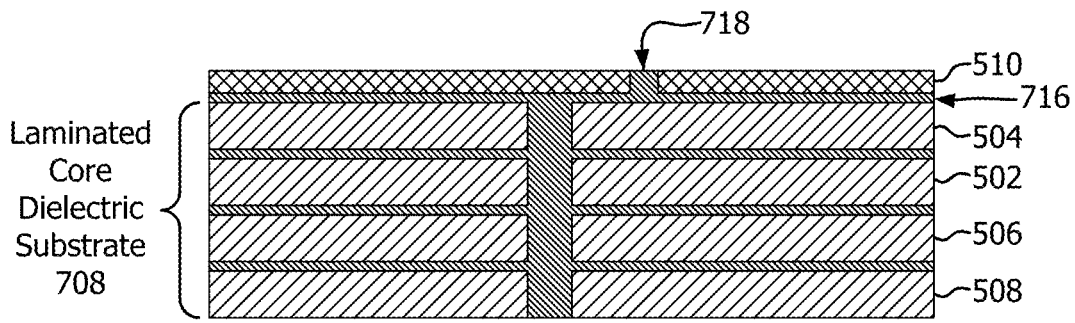
Figure 7M:
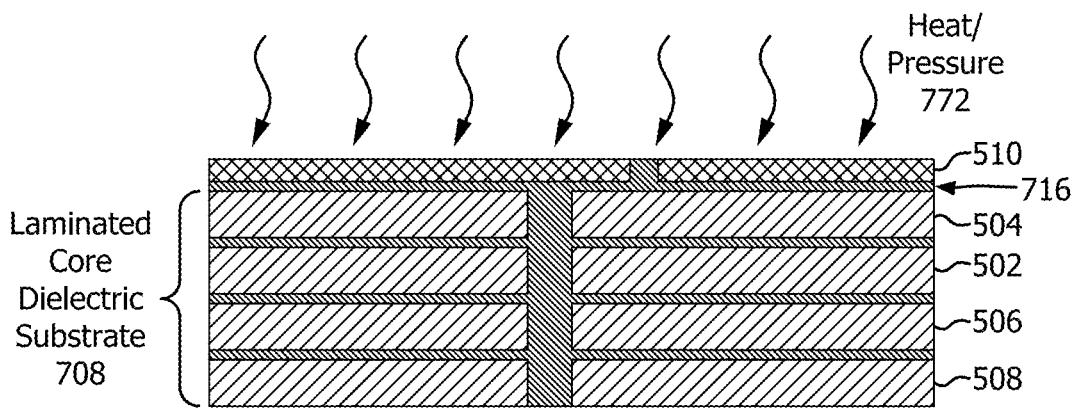

A first HDI substrate layer 510 is placed adjacent to the bonding agent 716 in FIG. 7L. The first HDI substrate layer 510 is formed using an HDI process. HDI processes are well known in the art, and therefore will not be described herein. Notably, the first HDI substrate layer 510 has a via 718 formed therein with an electrically conductive cladding. The electrically conductive cladding can comprise the same or different electrically conductive material (e.g., copper) used to form core via 406 and/or trace 410. Via 718 can include, but is not limited to, a micro-via drilled through an HDI substrate using a laser. The via 718 is located in the first HDI substrate layer 510 so that the trace 410 provides an electrical connection between the via 718 and the core via 406. Heat and pressure is applied to the stack during a second lamination process as shown by arrows 772 of FIG. 7M.

Figure 7N:
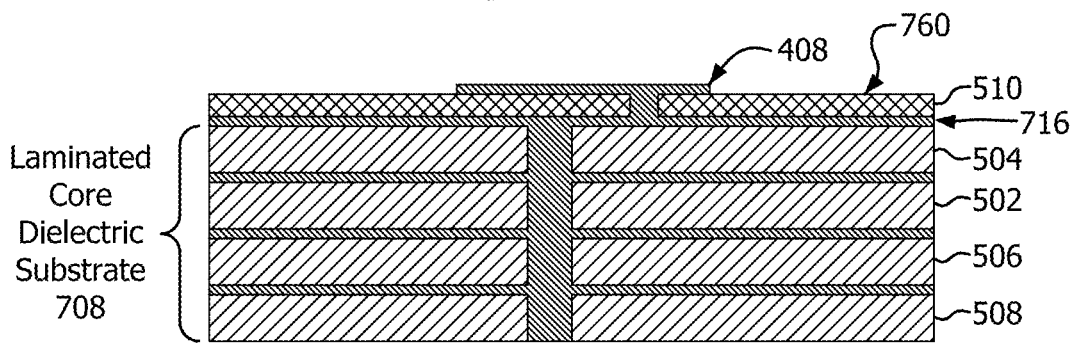
Figure 7O:
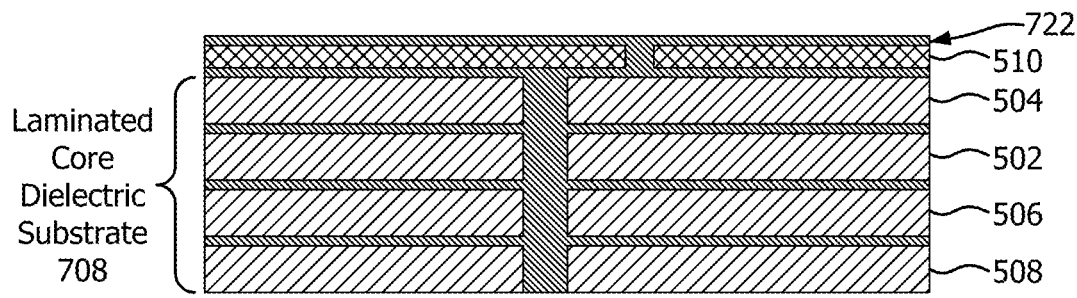

In FIG. 7N, trace 408 is formed on an exposed surface 760 of HDI substrate layer 510. An electrically conductive material (e.g., copper) is used to form trace 408. A bonding agent 722 is then disposed on the trace 408 and the exposed surface 760 of substrate layer 510, as shown in FIG. 7O. The bonding agent used here is the same as or different than the bonding agent used in FIG. 7B, FIG. 7D, FIG. 7F and/or FIG. 7K.

Figure 7P:
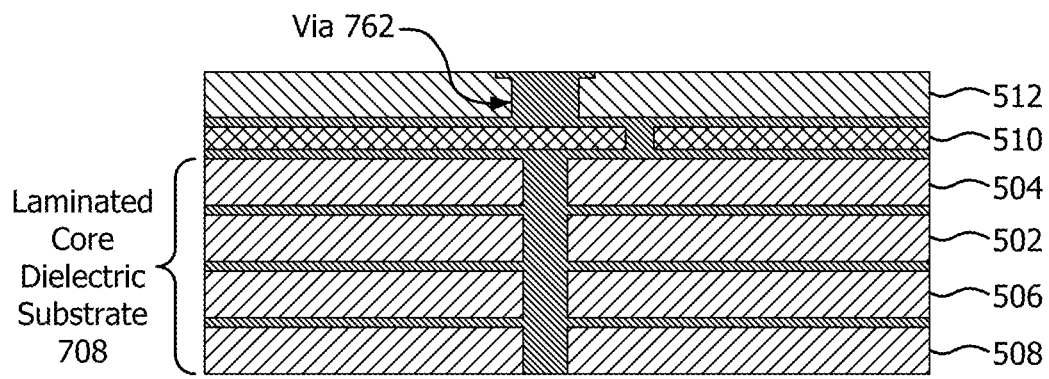
Figure 7Q:
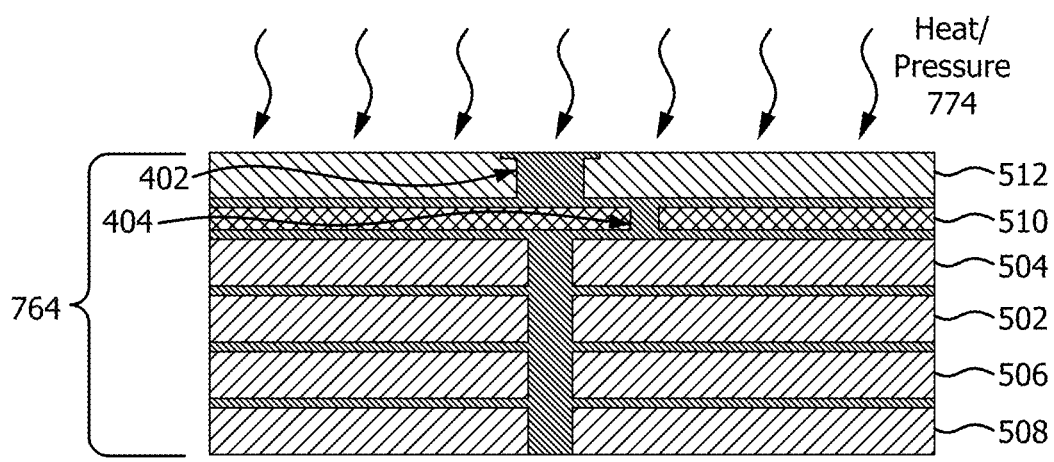

A second HDI substrate layer 512 is placed adjacent to the bonding agent 722 in FIG. 7P. The second HDI substrate layer 512 is formed using an HDI process. HDI processes are well known in the art, and therefore will not be described herein. Notably, the second HDI substrate layer 512 has a via 762 formed therein with an electrically conductive cladding. The electrically conductive cladding can comprise the same or different electrically conductive material (e.g., copper) used to form core via 406, trace 410, trace 408, and/or via 718. Via 762 can include, but is not limited to, a via drilled through an HDI substrate using a laser. The via 762 is located in the second HDI substrate layer 512 so that the trace 408 provides an electrical connection between the via 762 and the via 718. Heat and pressure is applied to the stack during a third lamination process as shown by arrows 774 of FIG. 7Q. As a result of the third lamination process, a laminated substrate 764 is created comprising a core via 406, a buried via 404 and a blind via 402 with traces 408, 410 electronically connecting the same to each other.

As evident from the above description, the present solution combines a connector and PWB architecture into a system that is VITA48 compliant and has capacity to support high speed +25 Gbps data rates at low BER of <1E-15. The connector has short pins that can be soldered into a structured blind via that is fabricated to securely hold the connector to survive the temperature, shock and vibrations of an avionics environment. The blind via is combined with a buried via to form a DT via. The DT via minimizes cross talk by reducing the parasitic capacitance between adjacent DT vias.

Figure 8:
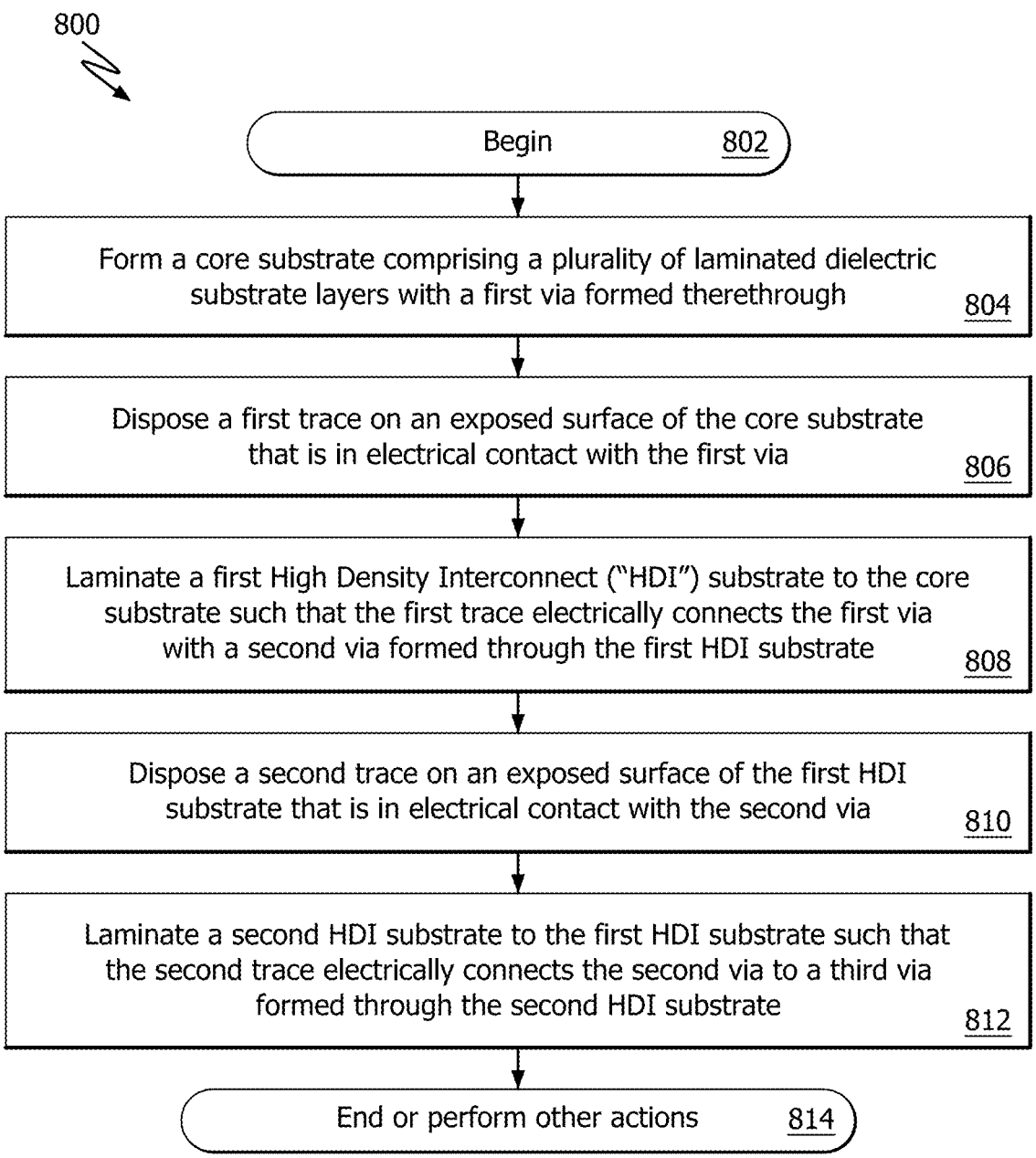
FIG. 8 provides a flow diagram of an illustrative method for making a PWB in accordance with the present solution.

Referring now to FIG. 8, there is provided a flow diagram of an illustrative method 800 for making a PWB in accordance with the present solution. The PWB is designed to reduce cross talk associated with a high speed electrical connector. The PWB and the high speed electrical connector collectively support high speed +25 Gbps data rates at low bit error rate of <1E-15.

Method 800 begins with 802 and continues with 804 where a core substrate (e.g., core substrate 708 of FIG. 7) is formed. The core substrate comprises a plurality of laminated dielectric substrate layers (e.g., dielectric layers 502-508 of FIGS. 5 and 7) with a first via (e.g., core via 406 of FIGS. 4-7) formed therethrough. In 806, a first trace (e.g., trace 410 of FIGS. 4-7) is disposed on an exposed surface (e.g., surface 758 of FIG. 7J) of the core substrate that is in electrical contact with the first via. In 808, a first HDI substrate (e.g., HDI substrate layer 510 of FIGS. 5 and 7) is laminated to the core substrate such that the first trace electrically connects the first via with a second via (e.g., via 404 of FIG. 4 and/or 718 of FIG. 7L) formed through the first HDI substrate. In 810, a second trace (e.g., trace 408 of FIGS. 4-7) is disposed on an exposed surface (e.g., surface 760 of FIG. 7N) of the first HDI substrate that is in electrical contact with the second via. In 812, a second HDI substrate (e.g., HDI substrate layer 512 of FIGS. 5 and 7) is laminated to the first HDI substrate such that the second trace electrically connects the second via to a third via formed through the second HDI substrate. Subsequently 814 is performed where method 800 ends or other actions are taken.

In some scenarios, the second via comprises a buried via with a central axis spatially offset (e.g., horizontally offset) from central axis of the first and third vias. The first and second vias having diameters which are smaller than a diameter of the third via. The central axis of the first via is aligned with the central axis of the third via (e.g., a blind via). The diameter of the second via (e.g., a micro-via) is smaller than the diameter of the first via.

Additionally or alternatively, the depth of the third via is selected to provide optimized solderability between the PWB and a pin of the high speed electrical connector. For example, the depth of the third via is 15 mils, the pin has a length between 25-30 mils, and/or a distance between the PWB and the high speed electrical connector when the pin is soldered in the third via is between 10-15 mils. The present solution is not limited to the particulars of this example.

Figure 9:
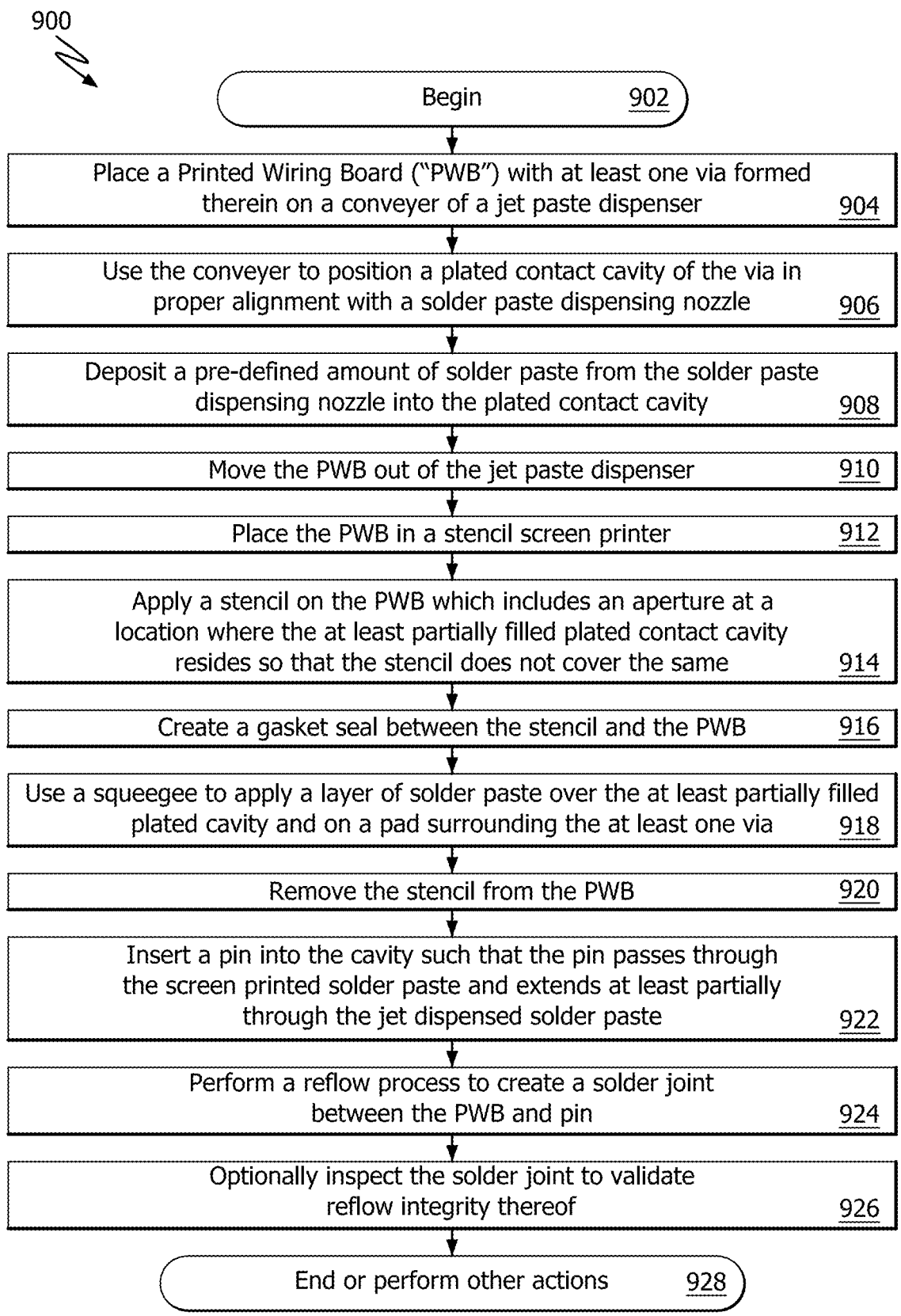
FIG. 9 provides a flow diagram of an illustrative method for filling a via of a PWB in accordance with the present solution.

Referring now to FIG. 9, there is provided a flow diagram of an illustrative method 900 for filling a via formed in a PWB. The via is a relatively small recessed via cavity used for a short pin contact reception and reflowed solder retention. The solder volume applied at each contact PWB receptacle cavity is critical to pin retention and reliable performance. The application of solder paste volume, solder paste composition, coverage methods, application equipment, and application accuracies are critical to final reflow process performance. The process for application of solder requires a specialized method and equipment to ensure an appropriate volume of solder is applied to each contact interface. The process described here is novel in volume and application methods. The novel process also allows for: automated accurate and repeatable placement of surface mount connectors into predefined locations and compliant pin retention features; accurate control of Circuit Card Assembly ("CCA") reflow process and temperatures to support both leaded and lead free component assembly; and a reliable inspection for validation of reflow integrity.

As shown in FIG. 9, method 900 begins with 902 and continues with 904 where a PWB (e.g., PWB 304 of FIG. 3, or PWB 414 of FIG. 4) is placed on a conveyer of a jet paste dispenser. The PWB has at least one via (e.g., via 306 of FIG. 3, or via 400 of FIG. 4) formed therein. The PWB is formed in accordance with the method discussed above in relation to FIG. 8. Jet paste dispensers are well known in the art, and therefore will not be described herein. The jet paste dispenser can include, but is not limited to, a My500™ SMT jet printer available from SMTnet of Portland, Me. The conveyor is used in 906 to position a plated contact cavity (e.g., aperture 324 of FIG. 3, or blind via 402 of FIG. 4) of the via in proper alignment with a solder paste dispensing nozzle. Solder paste dispensing nozzles are well known in the art, and therefore will not be described herein.

Once the plated contact cavity is aligned with the solder paste dispensing nozzle, a pre-defined amount of solder paste is deposited into the plated contact cavity as shown by 908. The solder paste dispensing is performed at an ambient temperature. The pre-defined amount of solder paste applied here is selected to ensure that a top of the jet dispensed solder paste is at the same level as a top surface of the PWB (e.g., surface 318 of FIG. 3), the same level as a top surface the via's pad (e.g., annular ring 326 of FIG. 3, or 424 of FIG. 4), or at a level between the PWB's top surface and the pad's top surface. In some scenarios, the solder paste includes, but is not limited to, 90 WT % 63/67 solder paste (50 Vol % solder alloy and 50 Vol % flux). The present solution is not limited in this regard. The solder paste can include any leaded solder or lead free solder. Subsequently, the PWB is moved out of the jet paste dispenser as shown by 910.

In 912, the PWB is placed in a stencil screen printer. Stencil screen printers are well known in the art, and therefore will not be described herein. The stencil screen printer can include, but is not limited to, an Ekra E5 stencil screen printer available from SMTnet of Portland, Me. Next in 914, a stencil is applied to the PWB. The stencil includes a solid planar material (e.g., a stainless aluminum foil) with an aperture formed therein at a location where the at least partially filled contact cavity resides so that the stencil does not cover the same. A gasket seal is created between the stencil and the PWB as shown by 916. In this regard, the stencil aperture may have a diameter that is slightly smaller than the diameter of the via's pad so as to facilitate a satisfactory gasket seal.

A squeegee is used in 918 to apply a layer of solder paste over the plated cavity and on the via's pad. The solder paste used in 918 is the same as or different than the solder paste used in 908. In some scenarios, the solder paste used here includes, but is not limited to, a 90 WT % 63/67 solder paste (50 Vol % solder alloy and 50 Vol % flux). The present solution is not limited in this regard. The solder paste can include any leaded solder or lead free solder. If the jet dispensed solder past has a top surface lower than the top surface of the via's pad, then the screen printed solder paste fully fills the remaining space of the via between the two surfaces. In all scenarios, the screen printed solder paste and the jet dispensed solder paste have a stacked arrangement, i.e., the screen printed solder paste is aligned with and stacked above the jet dispensed solder paste. Upon completing 918, the stencil is removed from the PWB as shown by 920.

Figure 13:
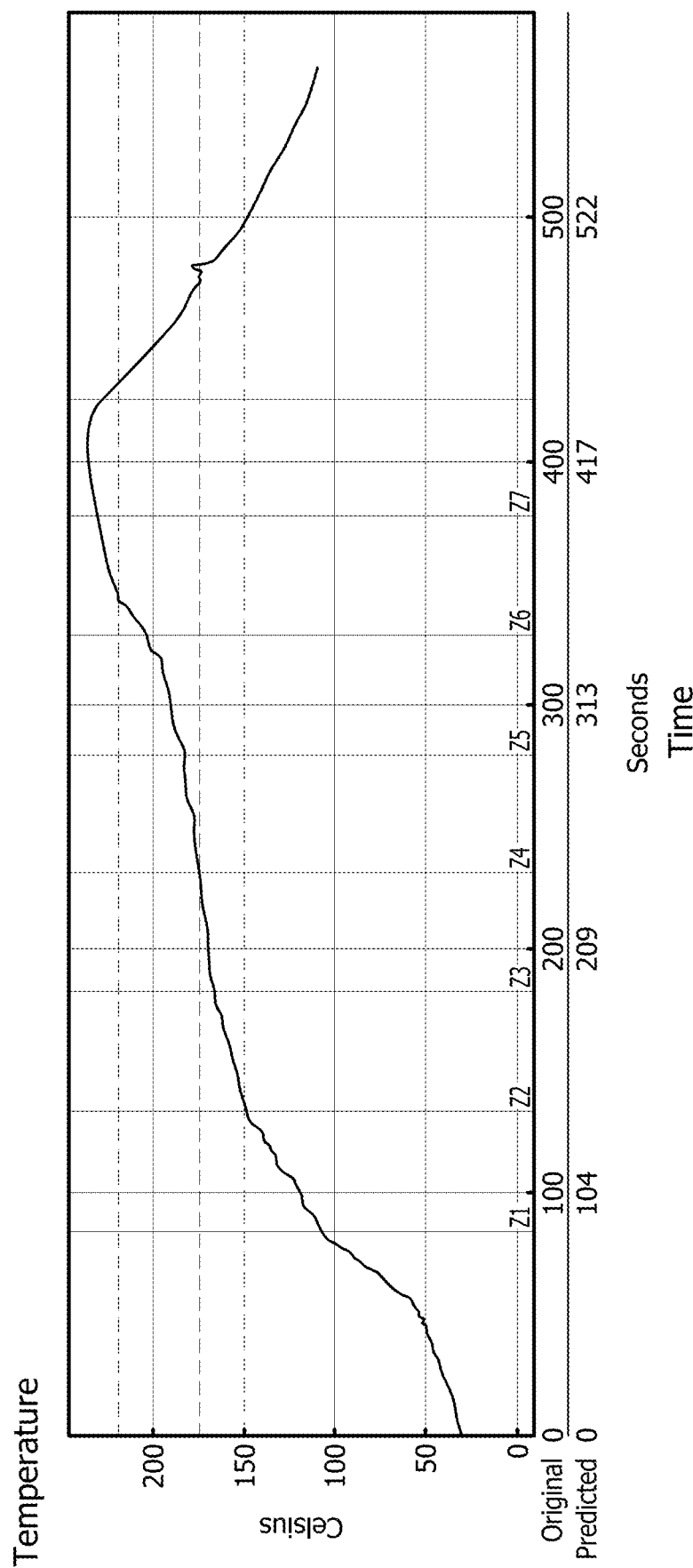
FIG. 13 is a graph showing an illustrative backwards compatible profile for a reflow process.

Next in 922, a pin (e.g., pin 302 of FIG. 3) is inserted into the cavity such that the pin passes through the screen printed solder paste and passes through at least a portion of the jet dispensed solder paste. A reflow process is then performed in 924 to create a solder joint between the PWB and the pin. The reflow process involves precipitating flux out of the solder paste, liquefying the metal in the solder paste, and creating the solder joint. In this regard, a convection reflow oven is used to apply heat to the PWB in accordance with the following temperature process: ramp a temperature of the convection oven to a flux activation temperature; soak the PWB at the flux activation temperature to activate the flux in the solder paste; ramp the temperature of the convection oven to a reflow temperature; and decrease the temperature of the convection oven at a controlled rate to solidify the solder. A graph showing an illustrative temperature profile is provided in FIG. 13. Upon completing the reflow process, the solder joint is optionally inspected to validate the reflow integrity thereof. An X-ray machine can be used to perform this inspection. X-ray machines are well known in the art, and therefore will not be described herein. Subsequently, 928 is performed where method 900 ends or other processing is performed.

Referring now to FIG. 10, there are provided illustrations that are useful for further understanding method 900 and the stacked arrangement of two solder paste applications. In FIG. 10A, a PWB 1000 is shown with a plated contact cavity 1002 formed therein. The plated contact cavity 1002 has a pad 1004. The plated contact cavity may define a blind via (e.g., blind via 306 of FIG. 3 or 402 of FIG. 4). Although one plated contact cavity is shown in FIG. 10A, the present solution is not limited in this regard. Any number of plated contact cavities can be formed in the PWB in accordance with a given application.

Figure 10A:
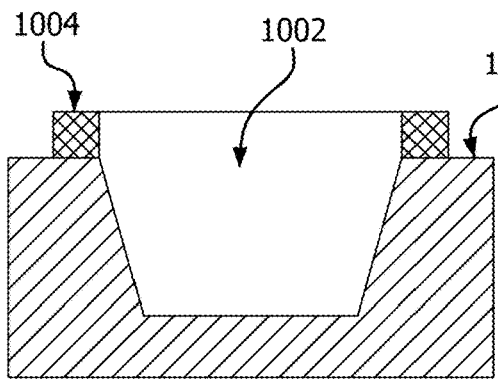
FIGS. 10A-10E (collectively referred to as "FIG. 10") provide illustrations that are useful for understanding how a via formed in a PWB is filled and a pin is connected to the PWB using the filled via.
Figure 10B:
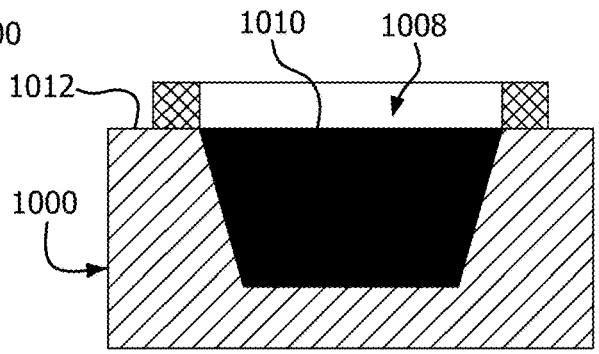

In FIG. 10B, a first application of solder paste 1008 is shown. A pre-defined amount of solder paste 1008 is disposed in the plated contact cavity using a jet paste dispenser. The pre-defined amount of solder paste is selected so that a top surface 1010 of the dispensed solder paste is horizontally aligned with a top surface 1012 of the PWB 1000. The jet paste dispenser can include, but is not limited to, a My500™ SMT jet printer available from SMTnet of Portland, Me. In some scenarios, the solder paste includes a 90 WT % 63/67 solder paste (50 Vol % solder alloy and 50 Vol % flux). The present solution is not limited in this regard. The solder paste can include any leaded solder or lead free solder.

Figure 10C:
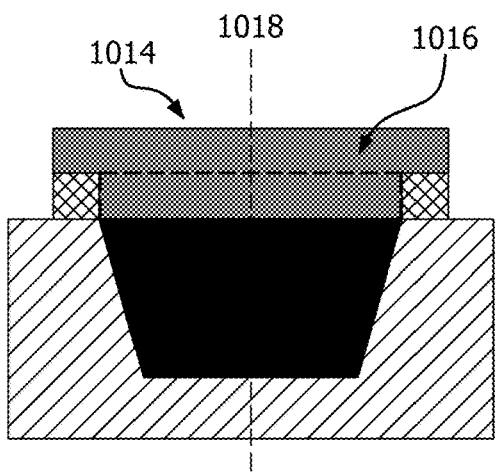

In FIG. 10C, a second application of solder paste 1014 is shown. The solder paste 1014 is printed on the PWB using a stencil screen printer. The amount of solder paste that is printed on the PWB is selected so that the solder paste 1014 fills the remaining empty portion 1016 of the plated contact cavity 1002 and covers the exposed portion of the pad 1004. In this way, the solder paste 1014 is stacked on top of the solder paste 1008. As such, both solder paste applications 1008, 1014 are vertically aligned with each other so as to have a center axis 1018. The stencil screen printer can include, but is not limited to, an Ekra E5 stencil screen printer available from SMTnet of Portland, Me. The solder paste 1014 can be the same as or different than the solder paste 1008.

Figure 10D:
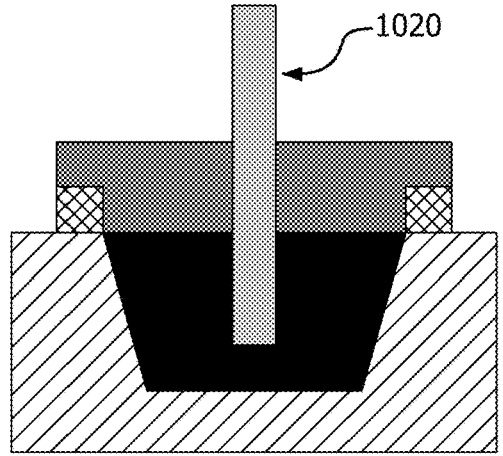

In FIG. 10D, an illustration is provided that shows a contact pin 1020 inserted into the plated contact cavity 1002. The contact pin 1020 passes through the solder paste 1014 and extends partially into solder paste 1008. Contact pins are well known in the art, and therefore will not be described here. Any known or to be known contact pin can be used herein without limitation.

Figure 10E:
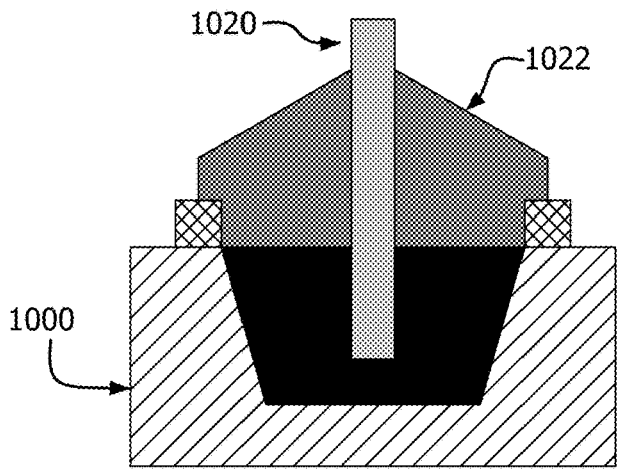

In FIG. 10E, an illustration is provided the shows a solder joint 1022 formed during a reflow process between the contact pin 1020 and PWB 1000. As can be seen in FIG. 10E, metal of the two solder paste applications collectively form the solder joint 1022.

Referring now to FIG. 11, there are provided illustrations that are useful for further understanding method 900 and the stacked arrangement of two solder paste applications. In FIG. 11A, a PWB 1100 is shown with a plated contact cavity 1102 formed therein. The plated contact cavity 1102 has a pad 1104. The plated contact cavity may define a blind via (e.g., blind via 306 of FIG. 3 or 402 of FIG. 4). Although one plated contact cavity is shown in FIG. 11A, the present solution is not limited in this regard. Any number of plated contact cavities can be formed in the PWB in accordance with a given application.

Figure 11A:
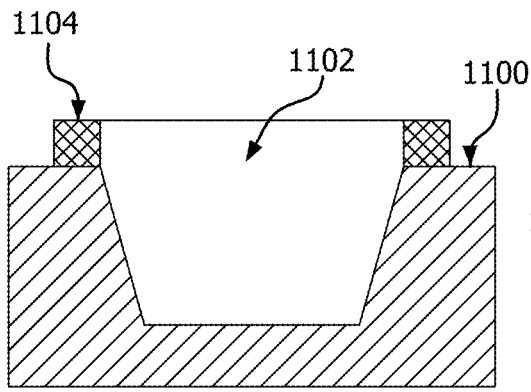
FIGS. 11A-11E (collectively referred to as "FIG. 11") provide illustrations that are useful for understanding how a via formed in a PWB is filled and a pin is connected to the PWB using the filled via.
Figure 11B:
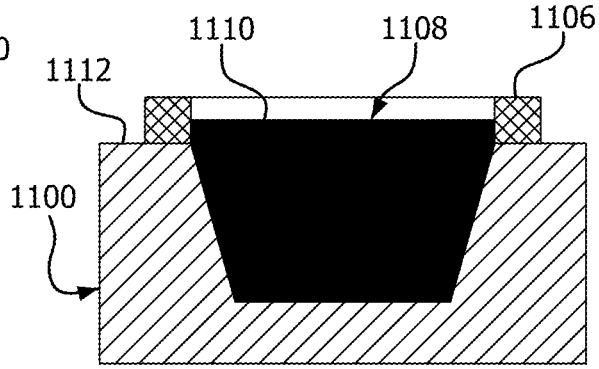

In FIG. 11B, a first application of solder paste 1108 is shown. A pre-defined amount of solder paste 1108 is disposed in the plated contact cavity using a jet paste dispenser. The pre-defined amount of solder paste is selected so that a top surface 1110 resides at level between a top surface 1112 of the PWB 1000 and a top surface 1106 of the via's pad 1104. A distance between surfaces 1106 and 1112 can be a few mils (e.g. 1-3 mils). The jet paste dispenser can include, but is not limited to, a My500™ SMT jet printer available from SMTnet of Portland, Me. In some scenarios, the solder paste includes a 90 WT % 63/67 solder paste (50 Vol % solder alloy and 50 Vol % flux). The present solution is not limited in this regard. The solder paste can include any leaded solder or lead free solder.

Figure 11C:
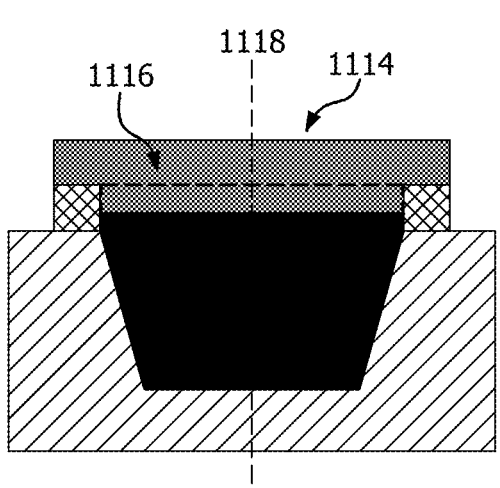

In FIG. 11C, a second application of solder paste 1114 is shown. The solder paste 1114 is printed on the PWB using a stencil screen printer. The amount of solder paste that is printed on the PWB is selected so that the solder paste 1114 fills the remaining empty portion 1116 of the plated contact cavity 1102 and covers the exposed portion of the pad 1104. In this way, the solder paste 1114 is stacked on top of the solder paste 1108. As such, both solder paste applications 1108, 1114 are vertically aligned with each other so as to have a center axis 1118. The stencil screen printer can include, but is not limited to, an Ekra E5 stencil screen printer available from SMTnet of Portland, Me. The solder paste 1214 can be the same as or different than the solder paste 1208.

Figure 11D:
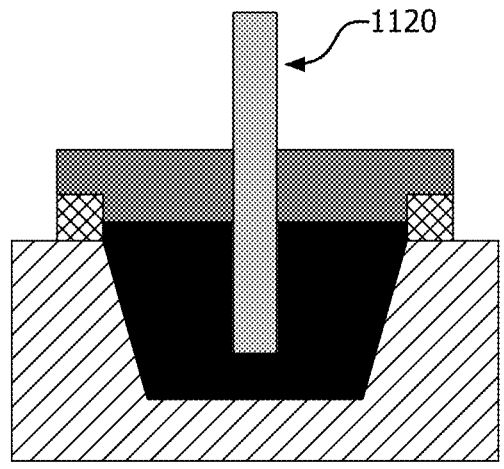

In FIG. 11D, an illustration is provided that shows a contact pin 1120 inserted into the plated contact cavity 1102. The contact pin 1120 passes through the solder paste 1114 and extends partially into solder paste 1108. Contact pins are well known in the art, and therefore will not be described here. Any known or to be known contact pin can be used herein without limitation.

Figure 11E:
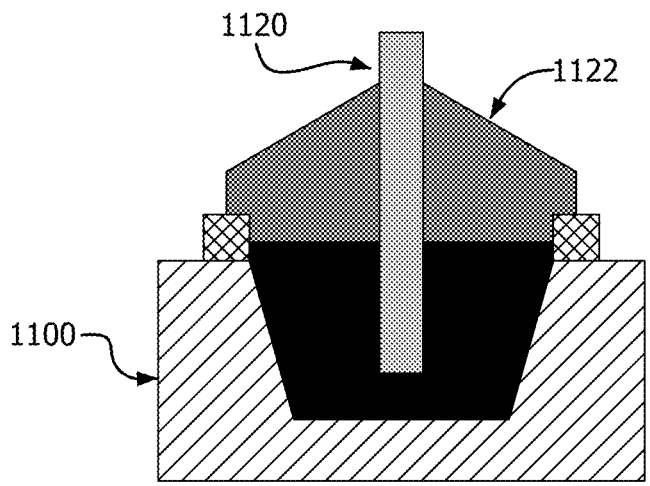

In FIG. 11E, an illustration is provided the shows a solder joint 1122 formed during a reflow process between the contact pin 1120 and PWB 1100. As can be seen in FIG. 11E, metal of the two solder paste applications collectively form the solder joint 1122.

Referring now to FIG. 12, there are provided illustrations that are useful for further understanding method 900 and the stacked arrangement of two solder paste applications. In FIG. 12A, a PWB 1200 is shown with a plated contact cavity 1202 formed therein. The plated contact cavity 1202 has a pad 1204. The plated contact cavity may define a blind via (e.g., blind via 306 of FIG. 3 or 402 of FIG. 4). Although one plated contact cavity is shown in FIG. 12A, the present solution is not limited in this regard. Any number of plated contact cavities can be formed in the PWB in accordance with a given application.

Figure 12A:
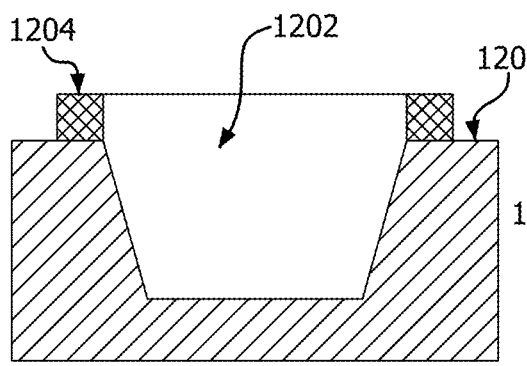
FIGS. 12A-12E (collectively referred to as "FIG. 12") provide illustrations that are useful for understanding how a via formed in a PWB is filled and a pin is connected to the PWB using the filled via.
Figure 12B:
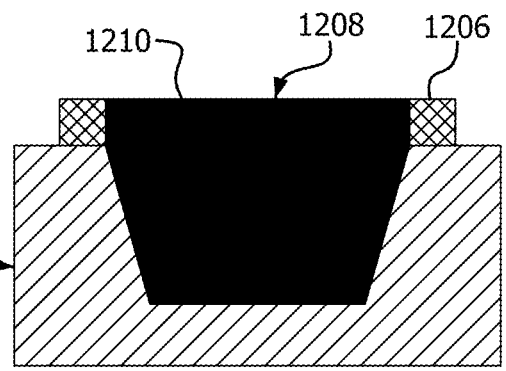

In FIG. 12B, a first application of solder paste 1208 is shown. A pre-defined amount of solder paste 1208 is disposed in the plated contact cavity using a jet paste dispenser. The pre-defined amount of solder paste is selected so that a top surface 1210 resides at level equal to the level of a top surface 1206 of the via's pad 1204. The jet paste dispenser can include, but is not limited to, a My500™ SMT jet printer available from SMTnet of Portland, Me. In some scenarios, the solder paste includes a 90 WT % 63/67 solder paste (50 Vol % solder alloy and 50 Vol % flux). The present solution is not limited in this regard. The solder paste can include any leaded solder or lead free solder.

Figure 12C:
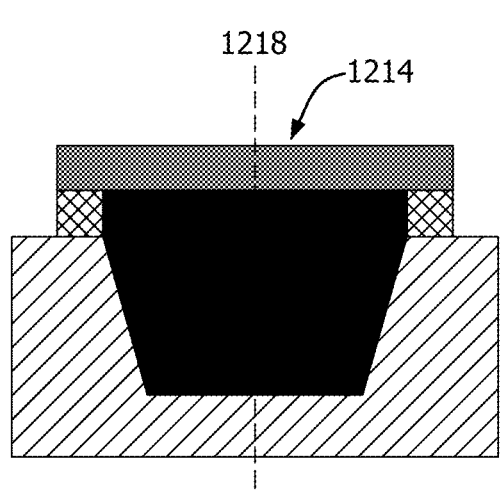

In FIG. 12C, a second application of solder paste 1214 is shown. The solder paste 1214 is printed on the PWB using a stencil screen printer. The amount of solder paste that is printed on the PWB is selected so that the solder paste 1214 covers the filled plated contact cavity 1202 and covers the exposed portion of the pad 1204. In this way, the solder paste 1214 is stacked on top of the solder paste 1208. As such, both solder paste applications 1208, 1214 are vertically aligned with each other so as to have a center axis 1218. The stencil screen printer can include, but is not limited to, an Ekra E5 stencil screen printer available from SMTnet of Portland, Me. The solder paste 1214 can be the same as or different than the solder paste 1208.

Figure 12D:
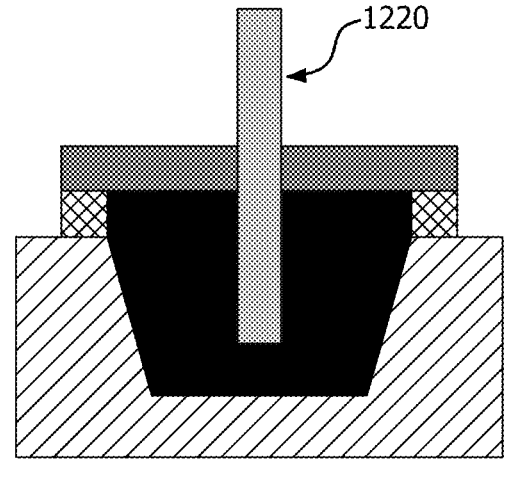

In FIG. 12D, an illustration is provided that shows a contact pin 1220 inserted into the plated contact cavity 1202. The contact pin 1220 passes through the solder paste 1214 and extends partially into solder paste 1208. Contact pins are well known in the art, and therefore will not be described here. Any known or to be known contact pin can be used herein without limitation.

Figure 12E:
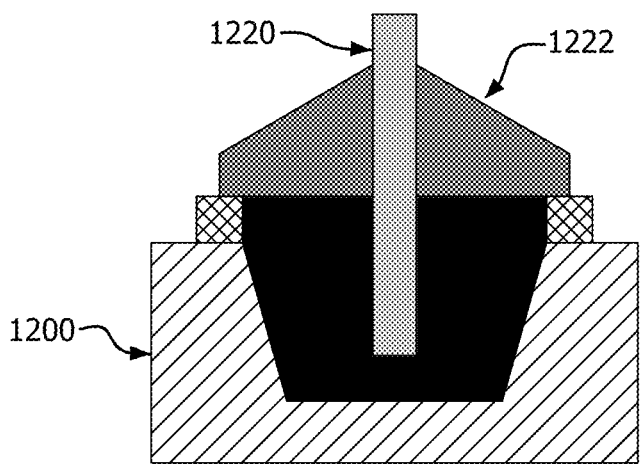

In FIG. 12E, an illustration is provided the shows a solder joint 1222 formed during a reflow process between the contact pin 1220 and PWB 1200. As can be seen in FIG. 12E, metal of the two solder paste applications collectively form the solder joint 1222.

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. A method for providing a soldered interface between a circuit board and a connector pin, comprising:
    using a jet paste dispenser to apply first solder into a plated contact cavity formed in the circuit board;
    using a stencil screen printer to apply second solder (a) over the plated contact cavity which was at least partially filled with the first solder by the jet paste dispenser and (b) over at least a portion of a pad surrounding the plated contact cavity;
    inserting the connector pin in the plated contact cavity such that the connector pin passes through the second solder and extends at least partially through the first solder; and
    performing a reflow process to heat the first and second solder so as to create a solder joint between the circuit board and the connector pin.

2. The method according to claim 1, wherein the first and second solders have a stacked arrangement.

3. The method according to claim 1, wherein an amount of the first solder applied by the jet paste dispenser is selected so that a top surface of the first solder is horizontally aligned with a top surface of the circuit board.

4. The method according to claim 2, wherein the second solder fills a space between the top surface of the first solder and the top surface of the pad.

5. The method according to claim 1, wherein an amount of the first solder applied by the jet paste dispenser is selected so that a top surface of the first solder resides at a level between a top surface of the circuit board and a top surface of the pad.

6. The method according to claim 5, wherein the second solder fills a space between the top surface of the first solder and the top surface of the pad.

7. The method according to claim 1, wherein an amount of the first solder applied by the jet paste dispenser is selected so that a top surface of the first solder is horizontally aligned with a top surface of the pad.

8. The method according to claim 1, wherein each of the first and second solders comprises a leaded solder paste or lead free solder paste.

9. The method according to claim 1, wherein the circuit board comprises:
    a core substrate comprising a plurality of laminated dielectric substrate layers with a first via formed therethrough,
    a first trace disposed on an exposed surface of the core substrate that is in electrical contact with the first via,
    a first High Density Interconnect ("HDI") substrate laminated to the core substrate such that the first trace electrically connects the first via with a second via formed through the first HDI substrate,
    a second trace disposed on an exposed surface of the first HDI substrate that is in electrical contact with the second via, and
    a second HDI substrate laminated to the first HDI substrate such that the second trace electrically connects the second via to a third via formed through the second HDI substrate;
    wherein the second via comprises a buried via with a central axis spatially offset from central axis of the first and third vias, and the first and second vias having diameters which are smaller than a diameter of the third via.

10. The method according to claim 9, wherein the third via comprises the plated contact cavity.

11. The method according to claim 9, wherein the central axis of the first via is aligned with the central axis of the third via, and the central axis of the second via is horizontally offset from the central axis of the first and third vias.

12. The method according to claim 9, wherein the diameter of the second via is smaller than the diameter of the first via.

* * * * *